United States Patent
Kuramoto et al.

(10) Patent No.: US 6,181,587 B1
(45) Date of Patent: Jan. 30, 2001

(54) ANALOG SIGNAL DETECTING CIRCUIT, AND AC SIDE CURRENT DETECTOR OF SEMICONDUCTOR POWER CONVERSION DEVICE

(75) Inventors: Yuuji Kuramoto; Hirotoshi Maekawa, both of Tokyo; Kiyoharu Anzai, Hyogo, all of (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/572,911

(22) Filed: May 17, 2000

(30) Foreign Application Priority Data

Nov. 24, 1999 (JP) .................................................. 11-332552

(51) Int. Cl.[7] .................................................. H02M 7/979
(52) U.S. Cl. ............................................. 363/98; 363/132
(58) Field of Search .................................. 363/41, 95, 98, 363/132; 318/811

(56) References Cited

U.S. PATENT DOCUMENTS

| | | | |
|---|---|---|---|
| 4,364,109 | * 12/1982 | Okado et al. | 363/41 |
| 4,772,996 | * 9/1988 | Hanei et al. | 363/41 |
| 5,450,306 | * 9/1995 | Garces et al. | 363/41 |
| 5,483,167 | * 1/1996 | Mikami | 324/510 |
| 5,631,812 | * 5/1997 | Sakano et al. | 363/37 |
| 5,729,449 | * 3/1998 | Takada et al. | 363/98 |
| 5,793,623 | * 8/1998 | Kawashima et al. | 363/56 |
| 5,805,438 | * 9/1998 | Takada et al. | 363/98 |

FOREIGN PATENT DOCUMENTS 10-54852   2/1998  (JP) .................................. G01R/19/02

* cited by examiner

*Primary Examiner*—Adolf Deneke Berhane
(74) *Attorney, Agent, or Firm*—Sughrue, Mion, Zinn, Macpeak & Seas, PLLC (57) ABSTRACT

Conventionally, there is a problem that it is impossible to provide an analog signal detecting circuit having high reliability and long lifetime under a bad environment since a photocoupler is used for electrical insulation of a digital signal. Then, an analog signal detecting circuit is provided with a carrier wave generating unit for generating a carrier wave, a pulse width modulating unit for pulse width modulating an analog signal inputted from the signal input terminal by using the carrier wave generated by the carrier wave generating unit and for outputting a digital signal, a reverse level shift HVIC for transmitting the digital signal from one power supply system to the other power supply system, and a demodulation unit for demodulating the digital signal transmitted to the other power supply system into an analog signal and for outputting it to a signal output terminal. As a result, even in the case where reference potentials are different from each other at signal input/output terminals, an analog signal can be detected.

10 Claims, 7 Drawing Sheets

ANALOG SIGNAL DETECTING CIRCUIT, AND AC SIDE CURRENT DETECTOR OF SEMICONDUCTOR POWER CONVERSION DEVICE

BACKGROUND OF THE INVENTION

1. Field of the Invention

The present invention relates to an analog signal detecting circuit in which reference potentials at signal input/output terminals are different from each other, and an AC side current detector of a semiconductor power conversion device using the same, and particularly, to an analog signal detecting circuit using a HVIC (High Voltage Integrated Circuit) characterized by including a non-optical semiconductor element, and a dead time fixing method of input/output signals.

2. Description of the Related Art

Figure 6:
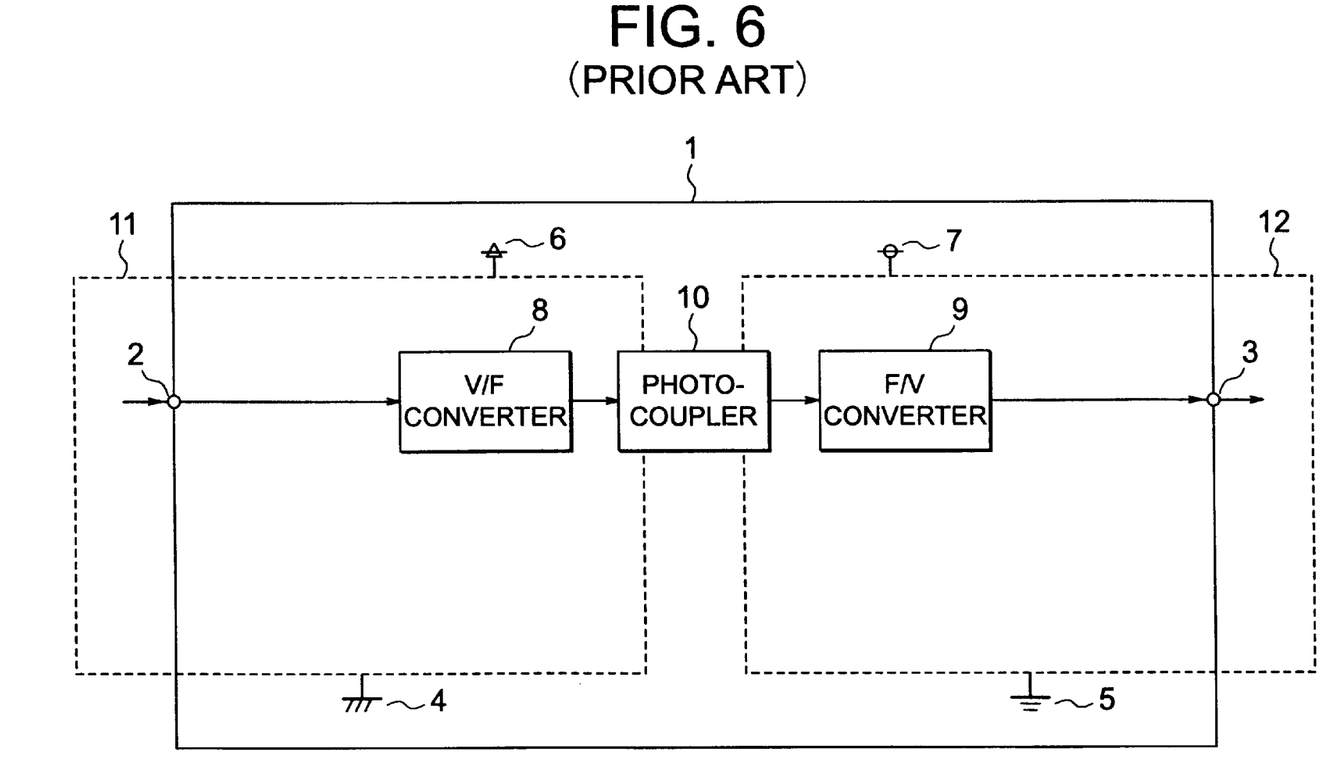
FIG. 6 is a view showing the structure of a conventional analog signal detecting circuit.

A conventional analog signal detecting circuit will be described with reference to the drawings. FIG. 6 is a view showing a structure of a conventional analog signal detecting circuit. FIG. 6 shows an example of the conventionally used analog signal detecting circuit in which reference potentials at signal input/output terminals are different from each other.

In FIG. 6, reference numeral 1 designates an analog signal detecting circuit; 2, a signal input terminal; 3, a signal output terminal; 4, a reference potential (GNDin) at the signal input terminal 2; 5, a reference potential (GNDout) at the signal output terminal 3; 6, a power supply (Vrefin) at the signal input terminal 2; 7, a power supply (Vrefout) at the signal output terminal 3; 8, a V/F converter; 9, a F/V converter; 10, a photocoupler; 11, a power supply system with the Vrefin and GNDin; and 12, a power supply system with the Vrefout and GNDout.

Next, the operation of the foregoing conventional analog signal detecting circuit will be described with reference to the drawing.

An analog signal is inputted to the V/F converter 8 through the signal input terminal 2. This V/F converter 8 is operated through the same power supply system 11 as the signal input terminal 2. The V/F converter 8 outputs a digital signal having a frequency uniquely corresponding to the signal level of the analog input signal.

The digital signal outputted from the V/F converter 8 is electrically insulated by the photocoupler 10 and is connected to the F/V converter 9 operating through the same power supply system 12 as the signal output terminal 3. This F/V converter 9 outputs an analog signal of a level uniquely corresponding to the frequency of the inputted digital signal.

As described above, in this prior art, an analog signal is converted into a digital signal having a frequency uniquely corresponding to the level of the input analog signal, is electrically insulated by the photocoupler 10, and is converted into an analog signal of a level uniquely corresponding to the frequency of the digital signal. In this way, even in the case where reference potentials at the input/output terminals are different from each other, the analog signal can be detected.

Figure 7:
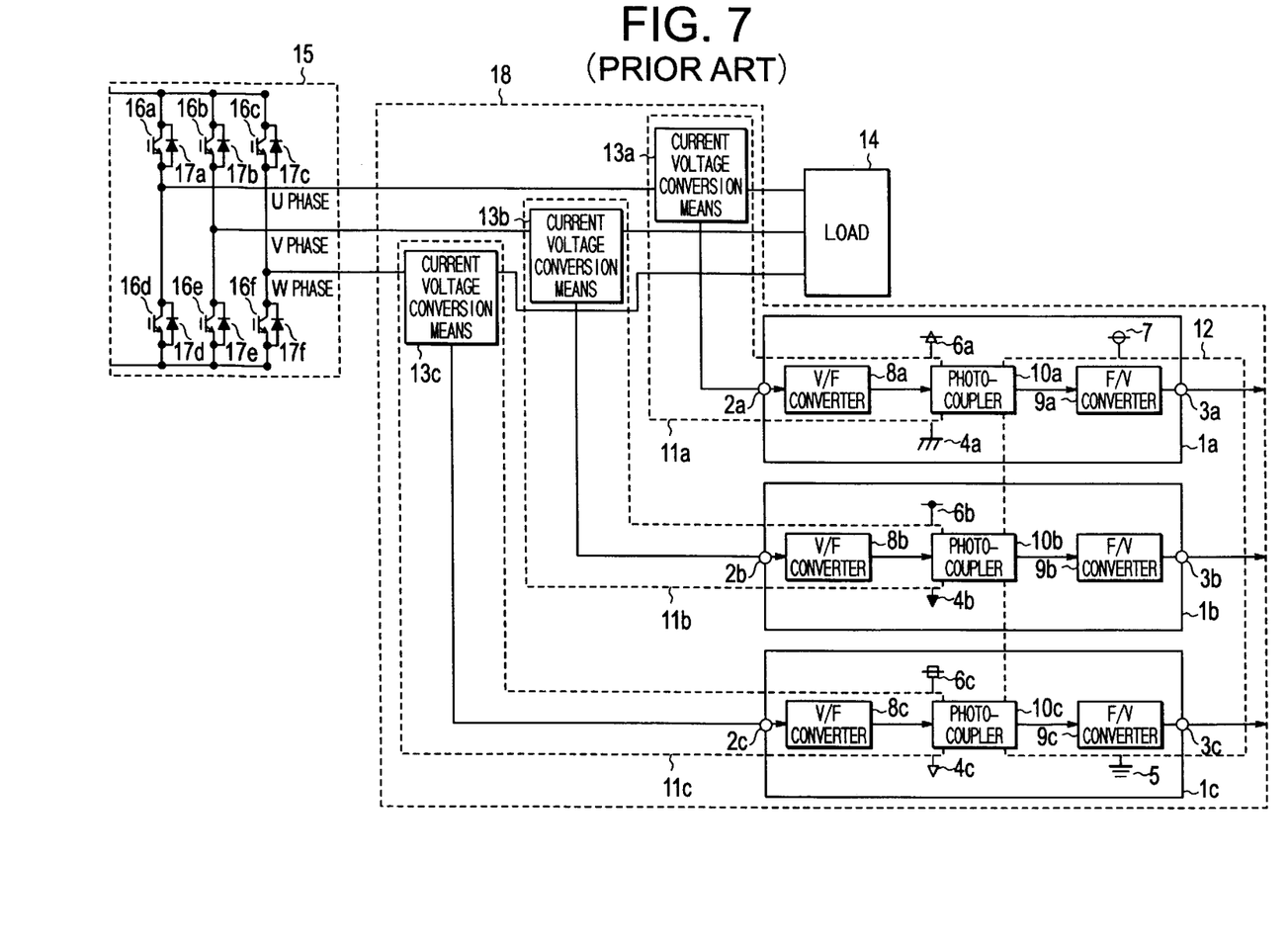
FIG. 7 is a view showing the structure of a conventional AC side current detector of a semiconductor power conversion device.

Subsequently, a conventional AC side current detector of a semiconductor power conversion device will be described with reference to the drawings. FIG. 7 is a view showing a structure of a conventional AC side current detector of a semiconductor power conversion device using the analog signal detecting circuit of FIG. 6.

In FIG. 7, reference character 1a designates a U-phase analog signal detecting circuit; 1b, a V-phase analog signal detecting circuit; 1c, a W-phase analog signal detecting circuit; 2a, a U-phase signal input terminal; 2b, a V-phase signal input terminal; 2c, a W-phase signal input terminal; 3a, a U-phase signal output terminal; 3b, a V-phase signal output terminal; 3c, a W-phase signal output terminal; 4a, a reference potential (GNDinu) at the U-phase signal input terminal 2a; 4b, a reference potential (GNDinv) at the V-phase signal input terminal 2b; 4c, a reference potential (GNDinw) at the W-phase signal input terminal 2c; 6a, a power supply (Vrefinu) at the U-phase input terminal 2a; 6b, a power supply (Vref inv) at the V-phase signal input terminal 2b; and 6c, a power supply (Vrefinw) at the W-phase signal input terminal 2c.

Beside, in the drawing, reference character 8a designates a U-phase V/F converter; 8b, a V-phase V/F converter; 8c, a W-phase V/F converter; 9a, a U-phase F/V converter; 9b, a V-phase F/V converter; 9c, aW-phaseF/Vconverter; 10a, aU-phasephotocoupler; 10b, a V-phase photocoupler; 10c, a W-phase photocoupler; 11a, a power supply system with the Vrefinu and GNDinu; 11b, a power supply system with the Vrefinv and GNDinv; and 11c, a power supply system with the Vrefinw and GNDinw.

Beside, in the drawing, reference character 13a designates U-phase current voltage conversion means; 13b, V-phase current voltage conversion means; 13c, W-phase current voltage conversion means; 14, a load; and 15, a semiconductor power conversion device.

Furthermore, in the drawing, reference character 16a designates a U-phase P-side switching element; 16b, a V-phase P-side switching element; 16c, a W-phase P-side switching element; 16d, a U-phase N-side switching element; 16e, a V-phase N-side switching element; 16f, a W-phase N-side switching element; 17a, a U-phase P-side flywheel diode; 17b, a V-phase P-side flywheel diode; 17c, a W-phase P-side flywheel diode; 17d, a U-phase N-side flywheel diode; 17e, a V-phase N-side flywheel diode; 17f, a W-phase Nside flywheel diode; and 18, an AC side current detector.

In FIG. 7, the semiconductor power conversion device 15 converts DC electric power from a not-shown power supply device into AC electric power, and supplies it to the load 14. For example, the semiconductor power conversion device 15 is an inverter, and the load 14 is a three-phase AC electric motor.

At this time, the conversion from the DC electric power to the AC electric power is carried out by switching the switching elements constituting a power element of the semiconductor power conversion device 15. Note that the power element is constituted by the switching elements 16a to 16f and the flywheel diodes 17a to 17f. In general, in the semiconductor power conversion device 15, switching control of the switching elements and protection of the power element are carried out by detecting the U-phase, V-phase, and W-phase currents.

In the AC side current detector 18, first, the U-phase, V-phase, and W-phase currents are converted into voltage signals by the current voltage conversion means 13a to 13c. For example, the current voltage conversion means 13a to 13c are shunt resistors. The voltage signals outputted from the respective U-phase, V-phase, and W-phase current voltage conversion means 13a to 13c are respectively operated on the electrically insulated power supply systems 11a to 11c, and are respectively converted into digital signals uniquely corresponding to the voltage signal levels by the V/F converters 8a to 8c operating on the respective power supply systems 11a to 11c.

Any of the U-phase, V-phase, and W-phase signal output terminals 3a to 3c of the AC side current detector 18 operates on the same power supply system 12. The digital signals outputted from the V/F converters 8a to 8c are electrically insulated by the photocouplers 10a to 10c, and are inputted to the F/V converters 9a to 9c. The F/V converters 9a to 9c convert the digital signals outputted from the photocouplers 10a to 10c into voltage signals of levels respectively uniquely corresponding to the frequencies of the digital signals.

As described above, in the conventional AC side current detector of the semiconductor power conversion device, AC side current detection of the semiconductor power conversion device is made possible by using the above conventional analog signal detecting circuit.

In the foregoing conventional analog signal detecting circuit, even in the case where potential references are different from each other at the input/output terminals, detection of the analog signal becomes possible. However, since the photocoupler 10 is used for electrical insulation of the digital signal, it is impossible to provide an analog signal detecting circuit having high reliability and long lifetime under a bad environment.

Besides, since the input analog signal is temporarily converted into the digital signal having a frequency uniquely corresponding to the analog signal level by using the V/F converter 8, there has been a problem that a dead time of the analog signal detecting circuit is changed in accordance with the analog signal level.

In the foregoing conventional AC side current detector of the semiconductor power conversion device, it is possible to detect an AC side current of the semiconductor power conversion device 15. However, the dead time of the analog signal detecting circuits 1a to 1c used in the AC side current detector 18 of the semiconductor power conversion device 15 is changed similarly.

Since the V/F converter 8a to 8c of the respective phases independently convert signals into digital signals each having a frequency uniquely corresponding to the analog signal level, with respect to the AC side current detection values at the signal output terminals 3a to 3c of the respective phases of the AC side current detector 18, concurrency can not be held at the respective phases.

In the case where protection of the power element constituting the semiconductor power conversion device 15 is made by using the thus detected AC side current, an operation delay follows when the frequency of the digital signal is low, and the protecting operation is not carried out well. Also in the case where it is used as a feedback value of current control, when the frequency of the digital signal is low, the response frequency of the current control system can not be set high.

Moreover, since the concurrency is not held, an abnormal component is superimposed on a composite vector of the AC side currents, high performance load control (for example, vector control of an AC electric motor or power factor control of a PWM converter) can not be realized.

SUMMARY OF THE INVENTION

The present invention has been made to solve the foregoing problems, and an object of the invention is to provide an analog signal detecting circuit in which even in the case where reference potentials are different from each other at signal input/output terminals, analog signal detection is made possible by using a HVIC of a non-optical semiconductor element, and a detection dead time of the analog signal detecting circuit can be made fixed. Moreover, another object of the invention is to provide an AC side current detector of a semiconductor power conversion device in which in the case where the above analog signal detecting circuit is applied to the AC side current detector of the semiconductor power conversion device, a detection dead time of a current detection value of each phase can be made fixed, and concurrency of detection can be held.

According to a first aspect of the invention, an analog signal detecting circuit comprises carrier wave generating means for generating a carrier wave, pulse width modulation means for pulse width modulating an analog signal inputted from a signal input terminal by using the carrier wave generated by the carrier wave generating means and for outputting a digital signal, a first non-optical semiconductor element for transmitting the digital signal from a first power supply system to a second power supply system, and demodulation means for demodulating the digital signal transmitted to the second power supply system into an analog signal and for outputting it to a signal output terminal.

According to a second aspect of the invention, the analog signal detecting circuit further comprises synchronizing signal generating means for generating a synchronizing signal, a second non-optical semiconductor element for transmitting the synchronizing signal from the second power supply system to the first power supply system, and sample-hold means for sampling and holding an analog signal inputted from the signal input terminal on the basis of the synchronizing signal transmitted to the first power supply system, wherein the carrier wave generating means generates the carrier wave on the basis of the synchronizing signal transmitted to the first power supply system, the pulse width modulation means pulse width modulates the sampled and held analog voltage signal by using the carrier wave generated by the carrier wave generating means and outputs the digital signal, and the demodulation means demodulates the digital signal transmitted to the second power supply system into the analog signal on the basis of the synchronizing signal generated by the synchronizing signal generating means and outputs it to the signal output terminal.

According to a third aspect of the invention, in the analog signal detecting circuit, the first non-optical semiconductor element is a reverse level shift HVIC.

According to a fourth. aspect of the invention, in the analog signal detecting circuit, the second non-optical semiconductor element is a forward level shift HVIC.

According to a fifth aspect of the invention, the demodulation means is a primary passive low-pass filter constituted by a resistor and a capacitor.

According to a sixth aspect of the invention, an AC side current detector of a semiconductor power conversion device comprises current voltage conversion means for converting a phase current of AC power outputted from the semiconductor power conversion device into a voltage signal, synchronizing signal generating means for generating a synchronizing signal, and an analog signal detecting circuit having different input/output reference potentials, for detecting an analog signal voltage on the basis of the synchronizing signal.

According to a seventh aspect of the invention, in the AC side current detector of the semiconductor power conversion device, the current voltage conversion means comprises U-phase current voltage conversion means for converting a U-phase current of the AC power into a voltage signal, V-phase current voltage conversion means for converting a V-phase current of the AC power into a voltage signal, and W-phase current voltage conversion means for converting a W-phase current of the AC power into a voltage signal.

According to an eighth aspect of the invention, in the AC side current detector of the semiconductor power conversion device, the analog signal detecting circuit comprises a U-phase analog signal detecting circuit for detecting a U-phase analog voltage signal on the basis of the synchronizing signal, a V-phase analog signal detecting circuit for detecting a V-phase analog voltage signal on the basis of the synchronizing signal, and a W-phase analog signal detecting circuit for detecting a W-phase analog voltage signal on the basis of the synchronizing signal.

According to a ninth aspect of the invention, in the AC side current detector of the semiconductor power conversion device, the U-phase analog signal detecting circuit comprises U-phase sample-hold means for sampling and holding a U-phase analog voltage signal on the basis of the synchronizing signal, U-phase carrier wave generating means for generating a U-phase carrier wave on the basis of the synchronizing signal, U-phase pulse width modulation means for pulse width modulating the sampled and held U-phase analog voltage signal by using the U-phase carrier wave generated by the U-phase carrier wave generating means and for outputting a U-phase digital signal, a first U-phase non-optical semiconductor element for transmitting the U-phase digital signal from a first U-phase power supply system to a second U-phase power supply system, U-phase demodulation means for demodulating the U-phase digital signal transmitted to the second U-phase power supply system into a U-phase analog signal, and a second U-phase non-optical semiconductor element for transmitting the synchronizing signal from the second U-phase power supply system to the U-phase sample-hold means and the U-phase carrier wave generating means in the first U-phase power supply system; the V-phase analog signal detecting circuit comprises V-phase sample-hold means for sampling and holding a V-phase analog voltage signal on the basis of the synchronizing signal, V-phase carrier wave generating means for generating a V-phase carrier wave on the basis of the synchronizing signal, V-phase pulse width modulation means for pulse width modulating the sampled and held V-phase analog voltage signal by using the V-phase carrier wave generated by the V-phase carrier wave generating means and for outputting a V-phase digital signal, a first V-phase non-optical semiconductor element for transmitting the V-phase digital signal from a first V-phase power supply system to a second V-phase power supply system, V-phase demodulation means for demodulating the V-phase digital signal transmitted to the second V-phase power supply system into a V-phase analog signal, and a second V-phase non-optical semiconductor element for transmitting the synchronizing signal from the second V-phase power supply system to the V-phase sample-hold means and the V-phase carrier wave generating means in the first V-phase power supply system; and the W-phase analog signal detecting circuit comprises W-phase sample-hold means for sampling and holding a W-phase analog voltage signal on the basis of the synchronizing signal, W-phase carrier wave generating means for generating a W-phase carrier wave on the basis of the synchronizing signal, W-phase pulse width modulation means for pulse width modulating the sampled and held W-phase analog voltage signal by using the W-phase carrier wave generated by the W-phase carrier wave generating means and for outputting a W-phase digital signal, a first W-phase non-optical semiconductor element for transmitting the W-phase digital signal from a first W-phase power supply system to a second W-phase power supply system, W-phase demodulation means for demodulating the W-phase digital signal transmitted to the second W-phase power supply system into a W-phase analog signal, and a second W-phase non-optical semiconductor element for transmitting the synchronizing signal from the second W-phase power supply system to the W-phase sample-hold means and the W-phase carrier wave generating means in the first W-phase power supply system.

According to a tenth aspect of the invention, in the AC side current detector of the semiconductor power conversion device, each of the first U-phase, V-phase, and W-phase non-optical semiconductor elements is a reverse level shift HVIC, and each of the second U-phase, V-phase, and W-phase non-optical semiconductor elements is a forward level shift HVIC.

DESCRIPTION OF THE PREFERRED EMRODTMENTS

Embodiment 1

Figure 1:
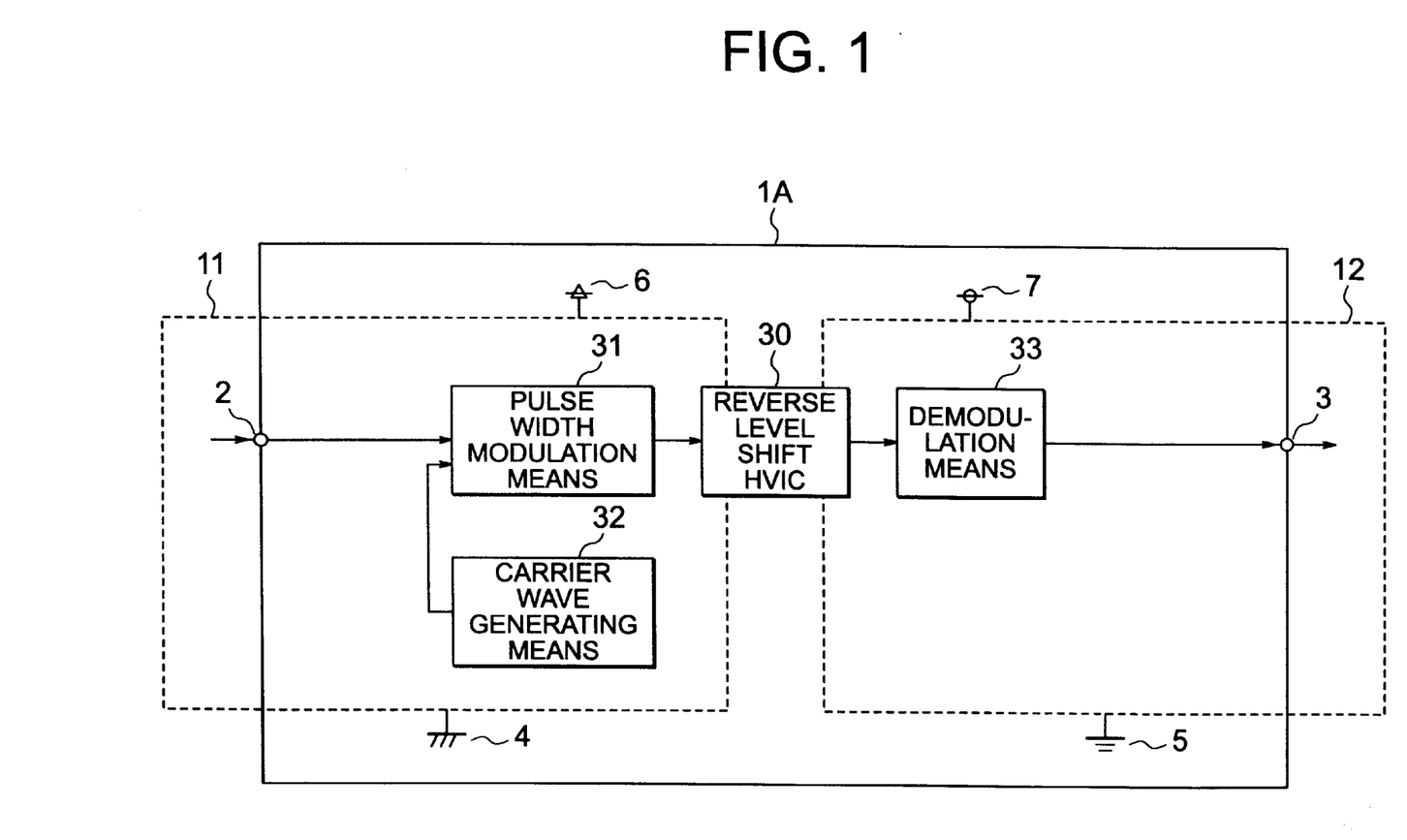
FIG. 1 is a view showing the structure of an analog signal detecting circuit of embodiment 1 of the invention.

An analog signal detecting circuit of embodiment 1 of this invention will be described with reference to the drawings. FIG. 1 is a view showing the structure of the analog signal detecting circuit of the embodiment 1 of this invention. Note that the same reference characters in the respective drawings designate the same or like portions.

In FIG. 1 reference characters 1A designates an analog signal detecting circuit; 30, a reverse level shift HVIC; 31, pulse width modulation means; 32, carrier wave generating means; and 33, demodulation means. Note that the other components are the same as FIG. 6.

Figure 2:
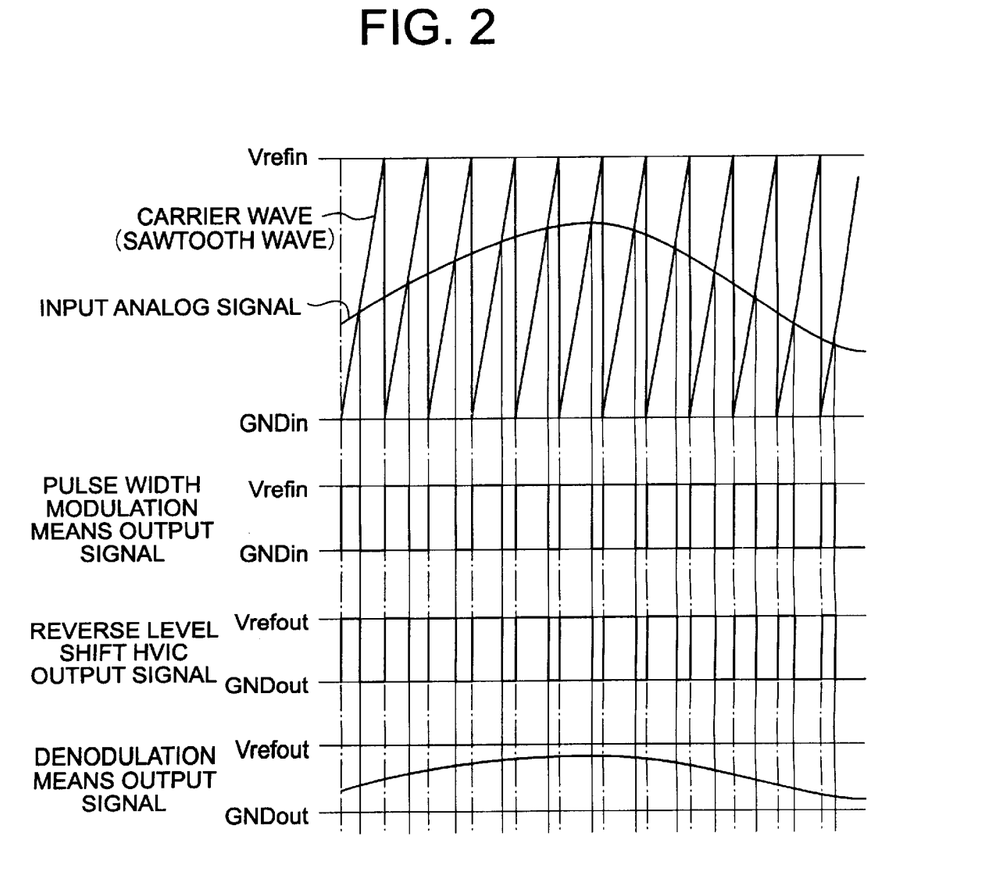
FIG. 2 is a timing chart showing the operation of the analog signal detecting circuit of the embodiment 1 of the invention.

Next, the operation of the analog signal detecting circuit of this embodiment 1 will be described with reference to the drawings. FIG. 2 is a timing chart showing the operation of the analog signal detecting circuit of the embodiment 1 of this invention.

The side of a signal input terminal 2 of the analog signal detecting circuit 1A is operated with a power supply system 11 of a power supply Vrefin 6 and a reference potential GNDin 4, and the side of a signal output terminal 3 is operated with a power supply system 12 of a power supply Vrefout 7 and a reference potential GNDout 5.

The pulse width modulation means 31 and the carrier wave generating means 32 are provided in the power supply system 11 of the analog signal detecting circuit 1A, and the demodulation means 33 is provided in the power supply system 12. Signal transmission is carried out from the power supply system 11 to the power supply system 12 by the reverse level shift HVIC 30.

The pulse width modulation means 31 pulse width modulates an analog signal inputted to the signal input terminal 2 by using the carrier wave generated by the carrier wave generating means 32 and outputs a pulse width modulated digital signal. This digital signal is transmitted from the power supply system 11 to the power supply system 12 through the reverse level shift HVIC 30. The digital signal transmitted to the power supply system 12 is demodulated to an analog signal by the demodulation means 33.

Next, waveforms in the analog signal detecting circuit 1A will be described. The carrier wave generating means 32 generates a sawtooth wave, as shown in the upper portion of FIG. 2, as a carrier wave. The demodulation means 33 is a primary passive low pass filter constituted by a resistor and capacitor. The pulse width modulation means 31 outputs, as shown in the second portion of FIG. 2, a waveform in accordance with the logic shown in the following equation (1).

$$\text{in the case of analog signal amplitude} \geq \text{carrier wave amplitude}$$
$$\text{Vref in 6 level output}$$

$$\text{in the case of analog signal amplitude} < \text{carrier wave amplitude}$$
$$\text{GNDin level output} \quad (1)$$

As described above, by converting the input analog signal into the digital signal by pulse width modulation, transmitting the signal to the power supply system having a different reference potential through the reverse level shift HVIC 30, and demodulating the signal, it becomes possible to construct the analog signal detecting circuit 1A having different reference potentials at the input/output terminals. Since this analog signal detecting circuit 1A carries out the signal transmission between the different reference potentials by using the reverse level shift HVIC 30, as compared with the conventional analog signal detecting circuit 1 constructed by using the photocoupler 10 or an isolation amplifier, the reliability can be made high, and the lifetime can be made long.

The analog signal detecting circuit of this embodiment 1 is the analog signal detecting circuit 1A in which the reference potential (GNDin) at the signal input terminal 2 is different from the reference potential (GNDout) at the signal output terminal 3. The above detection circuit 1A is constituted by the pulse width modulation means 31 for pulse width modulating the analog signal at the signal input terminal 2 and the carrier wave outputted by the carrier wave generating means 32 and for outputting the digital signal to the GNDin, the reverse level shift HVIC 30 for converting the digital signal to the GNDin into the digital signal to the GNDout and for outputting the signal, which is characterized by being formed of the non-optical semiconductor element, and the demodulation means 33 for demodulating the digital signal to the GNDout into the analog signal at the signal output terminal 3. Thus, it becomes possible to make analog signal detection in which the GNDin and the GNDout are different from each other.

That is, according to this embodiment 1, the analog signal detecting circuit having different input/output reference potentials is constructed such that the analog signal is converted into the pulse width modulated digital signal with the carrier wave signal at the input side reference potential, and the signal is converted into the digital signal to the output side reference potential by using the reverse level shift HVIC30, and is demodulated into the analog signal. Thus, without using the photocoupler of an optical semiconductor element or the isolation amplifier, it is possible to realize the analog signal detecting circuit having high reliability and long lifetime and having different input/output reference potentials.

Embodiment 2

Figure 3:
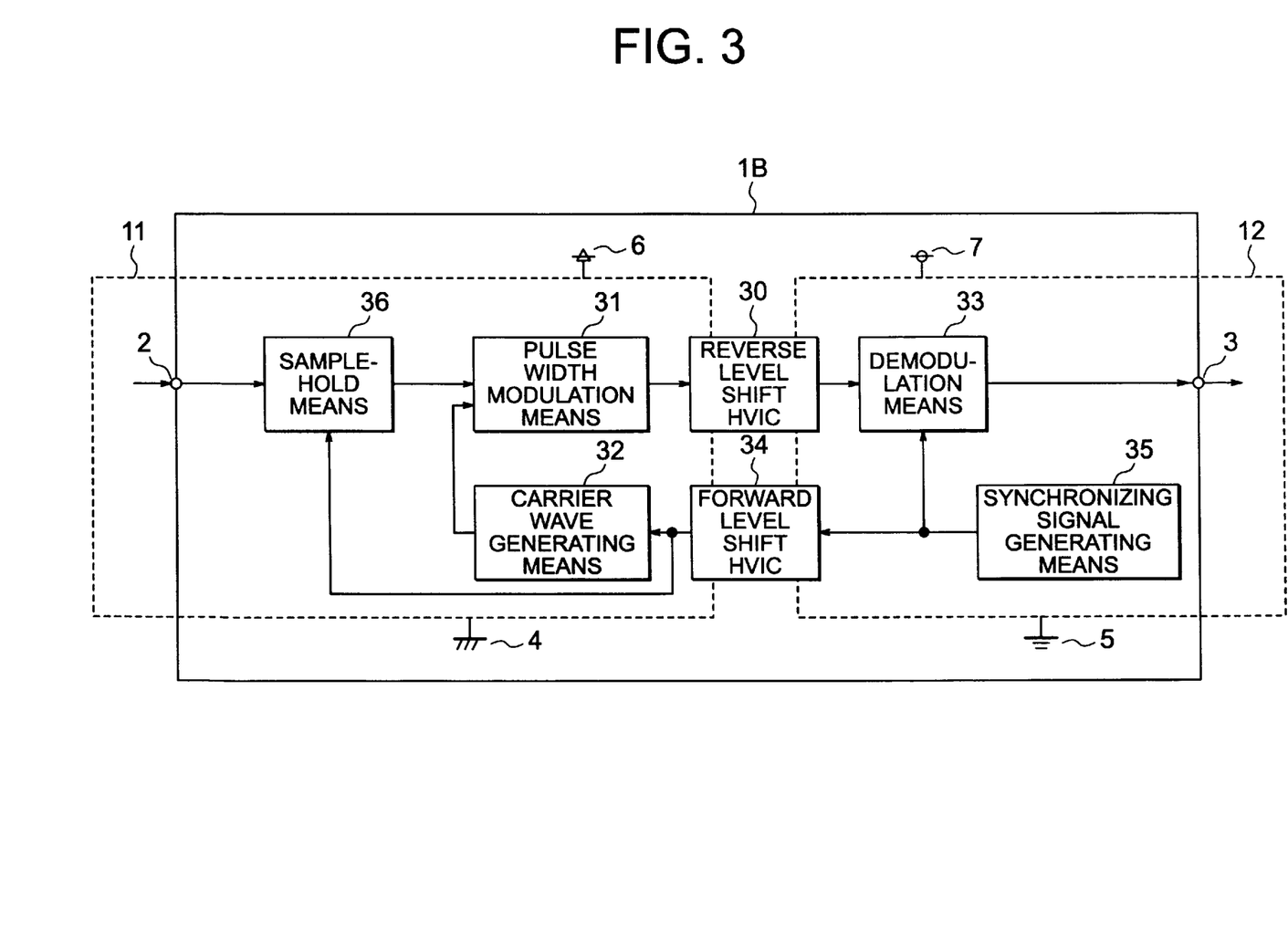
FIG. 3 is a view showing the structure of an analog signal detecting circuit of embodiment 2 of the invention.

An analog signal detecting circuit of embodiment 2 of this invention will be described with reference to the drawings. FIG. 3 is a view showing the structure of the analog signal detecting circuit of the embodiment 2 of this invention.

In FIG. 3, reference character 1B designates an analog signal detecting circuit; 34, a forward level shift HVIC; 35, synchronizing signal generating means; and 36, sample-hold means. The other components are the same as FIG. 1.

Figure 4:
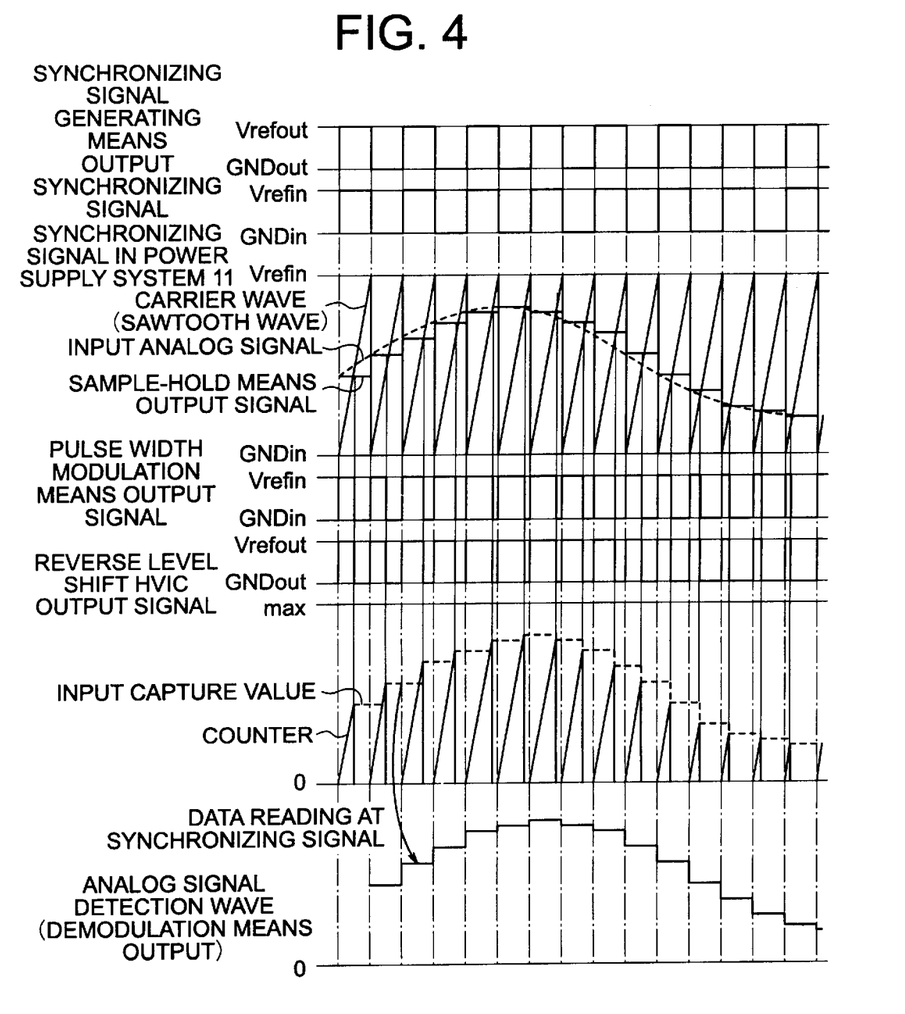
FIG. 4 is a timing chart showing the operation of the analog signal detecting circuit of the embodiment 2 of the invention.

Next, the operation of the analog signal detecting circuit of the embodiment 2 will be described with reference to the drawings. FIG. 4 is a timing chart showing the operation of the analog signal detecting circuit of the embodiment 2 of this invention.

Similarly to the embodiment 1, in the analog signal detecting circuit 1B, the side of a signal input terminal 2 is operated with a power supply system 11 of a power supply Vref in 6 and a reference potential GNDin 4, and the side of a signal output terminal 3 is operated with a power supply system 12 of a power supply Vrefout 7 and a reference potential GNDout 5. In the embodiment 2, in addition to the structural elements of the embodiment 1, the sample-hold means 36 is provided in the power supply system 11 of the analog signal detecting circuit 1B, and the synchronizing signal generating means 35 is provided in the power supply system 12. A synchronizing signal is transmitted through the forward level shift HVIC 34 from the power supply system 12 to the power supply system 11.

The synchronizing signal generated by the synchronizing signal generating means 35 is made a demodulation start trigger signal of demodulation means 33, and is transmitted to the power supply system 11 through the forward level shift HVIC 34 so that the signal is made a synchronizing signal of the sample-hold means 36 and a synchronizing signal of carrier wave generating means 32.

The carrier wave generating means 32 outputs a carrier wave synchronous with an edge of the synchronizing signal. An analog signal inputted to the signal input terminal 2 is converted into a sampled and held signal by the sample-hold means 36 on the basis of the synchronizing signal. This sampled and held analog signal is pulse width modulated by pulse width modulation means 31 using the carrier wave outputted from the carrier wave generating means 32 in the same method as the embodiment 1 to form a pulse width modulated digital signal. Then, by a reverse level shift HVIC 30, this digital signal is transmitted from the power source system 11 to the power source system 12. The digital signal transmitted to the power supply system 12 is demodulated into an analog signal by the demodulation means 33.

Next, waveforms in the analog signal detecting circuit 1B will be described. FIG. 4 shows waveforms in the case where the synchronizing signal generating means 35 generates the synchronizing signal by an interrupt operation of a micro processer, the demodulation means 33 is constructed by a timer and an input capture, the sample-hold means 36 is constructed by zeroth order hold, and the carrier wave is made a sawtooth wave.

As described above, the sample-hold means 36, the carrier wave generating means 32, and the demodulation means 33 are operated by the synchronizing signal outputted by the synchronizing signal generating means 35. Thus, to the analog signal inputted to the signal input terminal 2, the analog signal restored at the signal output terminal 3 becomes a signal having a dead time uniquely corresponding to the frequency of the synchronizing signal, and in the case where digital control is made using this signal, it becomes possible to easily carry out correction of the dead time.

According to the analog signal detecting circuit of the embodiment 2, in the analog signal detecting circuit of the embodiment 1, the synchronizing signal generating means 35 generates the synchronizing signal to the GNDout 5, the synchronizing signal to the GNDout 5 is made the demodulation start trigger of the demodulation means 33, the forward level shiftHVIC34, which is characterized by being formed of a non-optical semiconductor element, converts the synchronizing signal to the GNDout 5 into the synchronizing signal to the GNDin 4 and outputs it, the synchronizing signal to the GNDin 4 is made the synchronizing signal of the carrier wave generating means 32, and is made the synchronizing signal of the sample-hold means for sampling and holding the analog signal at the signal input terminal 2. Thus, the dead time of the analog signal at the signal output terminal 3 to the analog signal at the signal input terminal 2 can be made fixed.

That is, according to this embodiment 2, the analog signal detecting circuit having different input/output reference potentials is constructed such that the analog signal is converted into the pulse width modulated digital signal with the carrier wave signal at the input side reference potential, the signal is converted into the signal to the output side reference potential by using the reverse level shift HVIC 30 of the non-optical semiconductor element, and is demodulated into the analog signal, and further, the synchronizing signal is generated at the output side reference potential, this signal is made the demodulation start trigger, is converted into the synchronizing signal at the input side reference potential by the forward level shift HVIC 34 of the non-optical semiconductor element, this signal is made the sample-hold timing of the input analog signal, and is made the phase synchronizing signal of the carrier wave signal, so that the dead time generated in the analog signal detecting circuit can be made fixed. Thus, in the case where digital control is made by using the output signal of the analog signal detecting circuit, it becomes possible to easily correct the dead time.

Embodiment 3

Figure 5:
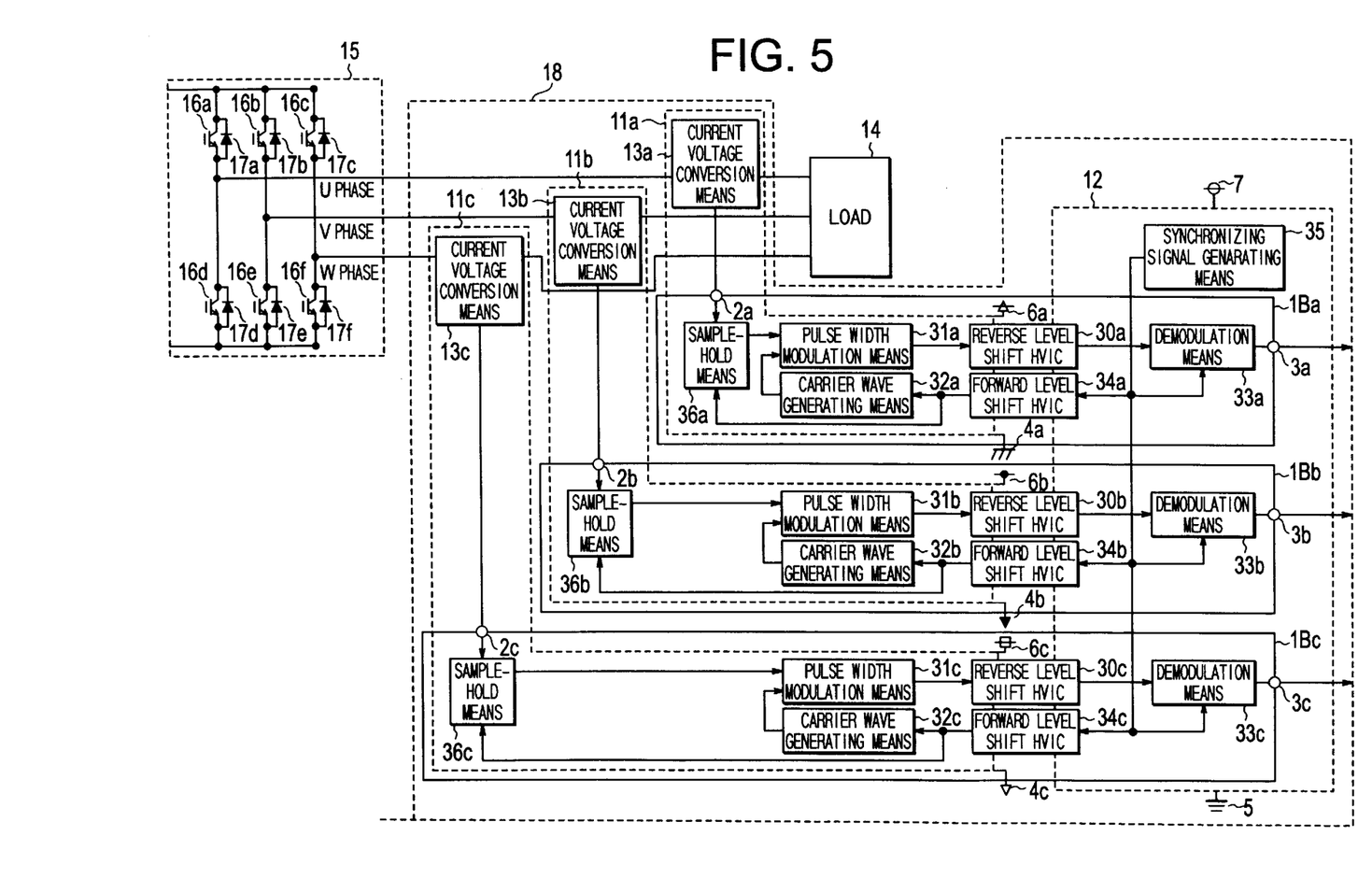
FIG. 5 is a view showing the structure of an AC side current detector of a semiconductor power conversion device of embodiment 3 of the invention.

An AC side current detector of a semiconductor power conversion device of embodiment 3 of the invention will be described with reference to the drawings. FIG. 5 is a view showing the structure of the AC side current detector, according to the embodiment 3 of the invention, of the semiconductor power conversion device using the analog signal detecting circuit of the embodiment 2.

In FIG. 5, reference character 1B*a* designates a U-phase analog signal detecting circuit; 1B*b*, a V-phase analog signal detecting circuit; and 1B*c*, a W-phase analog signal detecting circuit.

Besides, in the drawing, reference character 30*a* designates a U-phase reverse level shift HVIC; 30*b*, a V-phase reverse level shift HVIC; 30*c*, a W-phase reverse level shift HVIC; 31*a*, U-phase pulse width modulation means; 31*b*, V-phase pulse width modulation means; 31*c*, W-phase pulse width modulation means; 32*a*, U-phase carrier wave generating means; 32*b*, V-phase carrier wave generating means; 32*c*, W-phase carrier wave generating means; 33*a*, U-phase demodulation means; 33*b*, V-phase demodulation means; 33*c*, W-phase demodulation means; 34*a*, a U-phase forward level shift HVIC; 34*b*, a V-phase forward level shift HVIC; 34*c*, a W-phase forward level shift HVIC; 36*a*, U-phase sample-hold means; 36*b*, V-phase sample-hold means; and 36*c*, W-phase sample-hold means. The other components are the same as those of FIG. 3 and FIG. 7.

Next, the operation of the AC side current detector of the semiconductor power conversion device of the embodiment 3 will be described with reference to the drawing.

In FIG. 5, a semiconductor power conversion device 15 converts DC electric power from a not-shown power supply device into AC electric power, and supplies it to a load 14. For example, the semiconductor power conversion device 15 is an inverter, and the load 14 is a three-phase AC electric motor.

At this time, conversion from the DC electric power into the AC electric power is carried out by switching of switching elements constituting a power element of the semiconductor power conversion device 15. The power element is constituted by switching elements 16*a* to 16*f* and flywheel diodes 17*a* to 17*f*. In general, in the semiconductor power conversion device 15, by detecting U-phase, V-phase, and W-phase currents, switching control of the switching elements and protection of the power element are carried out.

The AC side current detector 18 converts the U-phase, V-phase, and W-phase currents into voltage signals by current voltage conversion means 13*a* to 13*c*. For example, the current voltage conversion means 13*a* to 13*c* are shunt resistors. The output signals of the current voltage conversion means 13*a* to 13*c* are respectively operated on different power supply systems 11*a*, 11*b*, and 11*c*. The respective U-phase, V-phase, and W-phase analog signal detecting circuits 1B*a* to 1B*c* have the same function and structure as the embodiment 2 and make the same operation.

In the embodiment 3, the signal output terminals 3*a* to 3*c* of the respective U-phase, V-phase, and W-phase analog signal detecting circuits 1B*a* to 1B*c* are constructed on the same power supply 12, and synchronizing signal generating means 35 is concentrated into one. By this, it becomes possible to synchronize the operations of the respective U-phase, V-phase, and W-phase sample-hold means 36*a* to 36*c*, carrier wave generating means 32*a* to 32*c*, and demodulation means 33*a* to 33*c*.

As described above, since currents outputted by the semiconductor power conversion device 15 are sampled at the same timing, and digital signals which were pulse width modulated by the carrier wave of the same phase are demodulated by the same timing, AC side current detection values at the respective U-phase, V-phase, and W-phase signal output terminals 3*a* to 3*c* become signals having the dead time uniquely corresponding to the frequency of the synchronizing signal, and a detection phase shift among the U-phase, V-phase, and W-phase does not occur.

In the case where high performance digital control of the load 14 (for example, vector control of an AC electric motor or high power factor control of a PWM converter) is carried out by using this signal, correction of the dead time can be easily carried out, and since there is no detection phase shift among the respective phases, it becomes possible to structure a high performance control system without erroneously detecting an abnormal component.

The AC side current detector of the semiconductor power conversion device of the embodiment 3 includes the current voltage conversion means 13*a* to 13*c* for converting detection object AC current values into voltage signals at the respective AC side phases, and the analog signal detecting circuits 1B*a* to 1B*c* of the embodiment 2, and further, at all phases of the AC side, the reference potentials of the demodulation means 33*a* to 33*c* of the analog signal detecting circuits 1B*a* to 1B*c* and the synchronizing signal generating means 35 are made common, and circuits for generating the synchronizing signal are concentrated into one synchronizing signal generating means 35. Thus, the detection dead time can be made fixed, and the detection phase delay at the respective AC side phases can be made fixed.

That is, according to this embodiment 3, such structure is made that the analog signal detecting circuits of the embodiment 2 are used for all AC side phases of the AC side current detector of the semiconductor power conversion device, and further, output side reference potentials of all phases are made common, and the synchronizing signal generating means is concentrated into one. Thus, the detection dead time of the AC side current detector and the detection phase delay at the respective AC side phases can be made fixed, and in the case where digital control is carried out by using the output signal of the AC side current detector, it becomes possible to easily carry out correction of the dead time and phase delay.

What is claimed is:

1. An analog signal detecting circuit, comprising:
   carrier wave generating means for generating a carrier wave;
   pulse width modulation means for pulse width modulating an analog signal inputted from a signal input terminal by using the carrier wave generated by said carrier wave generating means and for outputting a digital signal;
   a first non-optical semiconductor element for transmitting the digital signal from a first power supply system to a second power supply system; and
   demodulation means for demodulating the digital signal transmitted to the second power supply system into an analog signal and for outputting it to a signal output terminal.

2. An analog signal detecting circuit according to claim 1, further comprising:
   synchronizing signal generating means for generating a synchronizing signal;
   a second non-optical semiconductor element for transmitting the synchronizing signal from the second power supply system to the first power supply system; and
   sample-hold means for sampling and holding an analog signal inputted from the signal input terminal on the basis of the synchronizing signal transmitted to the first power supply system, wherein:
   said carrier wave generating means generates the carrier wave on the basis of the synchronizing signal transmitted to the first power supply system;
   said pulse width modulation means pulse width modulates the sampled and held analog voltage signal by using the carrier wave generated by said carrier wave generating means and outputs the digital signal; and
   said demodulation means demodulates the digital signal transmitted to the second power supply system into the analog signal on the basis of the synchronizing signal generated by said synchronizing signal generating means and outputs it to the signal output terminal.

3. An analog signal detecting circuit according to claim 2, wherein said first non-optical semiconductor element is a reverse level shift HVIC.

4. An analog signal detecting circuit according to claim 3, wherein said second non-optical semiconductor element is a forward level shift HVIC.

5. An analog signal detecting circuit according to claim 4, wherein said demodulation means is a primary passive low-pass filter constituted by a resistor and a capacitor.

6. An AC side current detector of a semiconductor power conversion device, comprising:
   current voltage conversion means for converting a phase current of AC power outputted from the semiconductor power conversion device into a voltage signal;
   synchronizing signal generating means for generating a synchronizing signal; and
   an analog signal detecting circuit having different input/output reference potentials, for detecting an analog signal voltage on the basis of the synchronizing signal.

7. An AC side current detector of a semiconductor power conversion device according to claim 6, wherein said current voltage conversion means comprises:
   U-phase current voltage conversion means for converting a U-phase current of the AC power into a voltage signal;
   V-phase current voltage conversion means for converting a V-phase current of the AC power into a voltage signal; and
   W-phase current voltage conversion means for converting a W-phase current of the AC power into a voltage signal.

8. An AC side current detector of a semiconductor power conversion device according to claim 7, wherein said analog signal detecting circuit comprises:
   a U-phase analog signal detecting circuit for detecting a U-phase analog voltage signal on the basis of the synchronizing signal;
   a V-phase analog signal detecting circuit for detecting a V-phase analog voltage signal on the basis of the synchronizing signal; and
   a W-phase analog signal detecting circuit for detecting a W-phase analog voltage signal on the basis of the synchronizing signal.

9. An AC side current detector of a semiconductor power conversion device according to claim 8, wherein:
   said U-phase analog signal detecting circuit comprises:
   U-phase sample-hold means for sampling and holding a U-phase analog voltage signal on the basis of the synchronizing signal;
   U-phase carrier wave generating means for generating a U-phase carrier wave on the basis of the synchronizing signal;
   U-phase pulse width modulation means for pulse width modulating the sampled and held U-phase analog voltage signal by using the U-phase carrier wave generated by the U-phase carrier wave generating means and for outputting a U-phase digital signal;
   a first U-phase non-optical semiconductor element for transmitting the U-phase digital signal from a first U-phase power supply system to a second U-phase power supply system;
   U-phase demodulation means for demodulating the U-phase digital signal transmitted to the second U-phase power supply system into a U-phase analog signal; and
   a second U-phase non-optical semiconductor element for transmitting the synchronizing signal from the second U-phase power supply system to the U-phase sample-hold means and the U-phase carrier wave generating means in the first U-phase power supply system;
   wherein said V-phase analog signal detecting circuit comprises:
   V-phase sample-hold means for sampling and holding a V-phase analog voltage signal on the basis of the synchronizing signal;

V-phase carrier wave generating means for generating a V-phase carrier wave on the basis of the synchronizing signal;

V-phase pulse width modulation means for pulse width modulating the sampled and held V-phase analog voltage signal by using the V-phase carrier wave generated by the V-phase carrier wave generating means and for outputting a V-phase digital signal;

a first V-phase non-optical semiconductor element for transmitting the V-phase digital signal from a first V-phase power supply system to a second V-phase power supply system;

V-phase demodulation means for demodulating the V-phase digital signal transmitted to the second V-phase power supply system into a V-phase analog signal; and a second V-phase non-optical semiconductor element for transmitting the synchronizing signal from the second V-phase power supply system to the V-phase sample-hold means and the V-phase carrier wave generating means in the first V-phase power supply system; and wherein said W-phase analog signal detecting circuit comprises:

W-phase sample-hold means for sampling and holding a W-phase analog voltage signal on the basis of the synchronizing signal;

W-phase carrier wave generating means for generating a W-phase carrier wave on the basis of the synchronizing signal;

W-phase pulse width modulation means for pulse width modulating the sampled and held W-phase analog voltage signal by using the W-phase carrier wave generated by the W-phase carrier wave generating means and for outputting a W-phase digital signal;

a first W-phase non-optical semiconductor element for transmitting the W-phase digital signal from a first W-phase power supply system to a second W-phase power supply system;

W-phase demodulation means for demodulating the W-phase digital signal transmitted to the second W-phase power supply system into a W-phase analog signal; and a second W-phase non-optical semiconductor element for transmitting the synchronizing signal from'the second W-phase power supply system to the W-phase sample-hold means and the W-phase carrier wave generating means in the first W-phase power supply system.

10. An AC side current detector of a semiconductor power conversion device according to claim 9, wherein each of the first U-phase, V-phase, and W-phase non-optical semiconductor elements is a reverse level shift HVIC, and each of the second U-phase, V-phase, and W-phase non-optical semiconductor elements is a forward level shift HVIC.

* * * * *